(12) United States Patent
Takimoto et al.

(10) Patent No.: US 12,317,424 B2
(45) Date of Patent: May 27, 2025

(54) WIRING CIRCUIT BOARD

(71) Applicant: NITTO DENKO CORPORATION, Osaka (JP)

(72) Inventors: Kenya Takimoto, Osaka (JP); Naoki Shibata, Osaka (JP); Hayato Takakura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 298 days.

(21) Appl. No.: 17/610,058

(22) PCT Filed: Apr. 8, 2020

(86) PCT No.: PCT/JP2020/015871
§ 371 (c)(1),
(2) Date: Nov. 9, 2021

(87) PCT Pub. No.: WO2020/230487
PCT Pub. Date: Nov. 19, 2020

(65) Prior Publication Data
US 2022/0256712 A1 Aug. 11, 2022

(30) Foreign Application Priority Data
May 16, 2019 (JP) .................................. 2019-092725

(51) Int. Cl.
*H05K 3/24* (2006.01)
*H05K 1/11* (2006.01)
(Continued)

(52) U.S. Cl.
CPC ............. *H05K 3/244* (2013.01); *H05K 1/117* (2013.01); *H05K 3/067* (2013.01); *H05K 3/403* (2013.01); *H05K 3/44* (2013.01); *H05K 2203/072* (2013.01)

(58) Field of Classification Search
CPC .......... H05K 3/24; H05K 3/244; H05K 1/117; H05K 3/067; H05K 3/403; H05K 3/44
(Continued)

(56) References Cited

U.S. PATENT DOCUMENTS 6,399,899 B1    6/2002  Ohkawa et al.
10,636,811 B1*  4/2020  Chiu ...................... H10B 43/27
                        (Continued)

FOREIGN PATENT DOCUMENTS

CN      205793638 U    12/2016
JP      2001-209918 A   8/2001
                        (Continued)

OTHER PUBLICATIONS

International Search Report Issued in PCT/JP2020/015871 on Jul. 21, 2020.
(Continued)

*Primary Examiner* — Tremesha W Burns
(74) *Attorney, Agent, or Firm* — Edwards Neils LLC; Jean C. Edwards, Esq.

(57) ABSTRACT

A wiring circuit board includes a metal support layer, a base insulating layer disposed on one side in a thickness direction of the metal support layer, and a conductive layer disposed on one side in the thickness direction of the base insulating layer, and including a first terminal and a ground lead residual portion electrically connected to the first terminal. A thickness of the ground lead residual portion is thinner than a thickness of the first terminal.

10 Claims, 10 Drawing Sheets

(51) Int. Cl.
*H05K 3/06* (2006.01)
*H05K 3/40* (2006.01)
*H05K 3/44* (2006.01)

(58) Field of Classification Search
USPC .......................................................... 174/250
See application file for complete search history.

(56) References Cited

U.S. PATENT DOCUMENTS

| | | |
|---|---|---|
| 2005/0061542 A1 | 3/2005 | Aonuma et al. |
| 2007/0074899 A1* | 4/2007 | Aonuma .................. H05K 3/44 174/260 |
| 2009/0255717 A1 | 10/2009 | Mizushima et al. |

FOREIGN PATENT DOCUMENTS

| | | |
|---|---|---|
| JP | 2002-020898 A | 1/2002 |
| JP | 2005-100488 A | 4/2005 |
| JP | 2009-118626 A1 | 5/2009 |
| JP | 2009-259315 A | 11/2009 |
| JP | 2010-080722 A | 4/2010 |
| JP | 2010-126768 A | 6/2010 |
| JP | 2010-171040 A | 8/2010 |
| JP | 2013-186933 A | 9/2013 |
| JP | 2013-206488 A | 10/2013 |
| JP | 2013-214763 A | 10/2013 |
| JP | 2016-006705 A | 1/2016 |
| JP | 2019-212349 A | 12/2019 |

OTHER PUBLICATIONS

Written Opinion Issued in PCT/JP2020/015871 on Jul. 21, 2020.
International Preliminary Report on Patentability issued by WIPO on Nov. 16, 2021, in connection with International Patent Application No. PCT/JP2020/015871.
Office Action, issued by the Japanese Patent Office on Feb. 28, 2023, in connection with Japanese Patent Application No. 2021-145499.
Office Action, issued by the Japanese Patent Office on Aug. 8, 2023, in connection with Japanese Patent Application No. 2021-145499.
Office Action, issued by the Japanese Patent Office on Jan. 9, 2024, in connection with Japanese Patent Application No. 2021-145499.
Office Action, issued by the Taiwanese Patent Office on Dec. 26, 2023, in connection with Taiwanese Patent Application No. 109115378.
Office Action, issued by the Korean Intellectual Property Office on Jul. 15, 2024, in connection with Korean Patent Application No. 10-2021-7036561.
Office Action, issued by the Vietnamese Patent Office on Jan. 17, 2025, in connection with Vietnamese Patent Application No. 1-2021-08042.

* cited by examiner

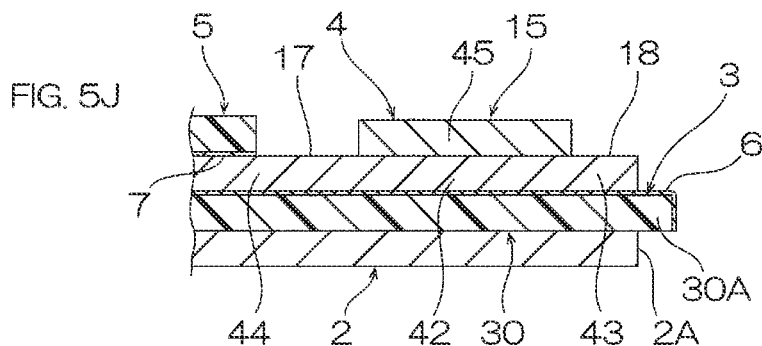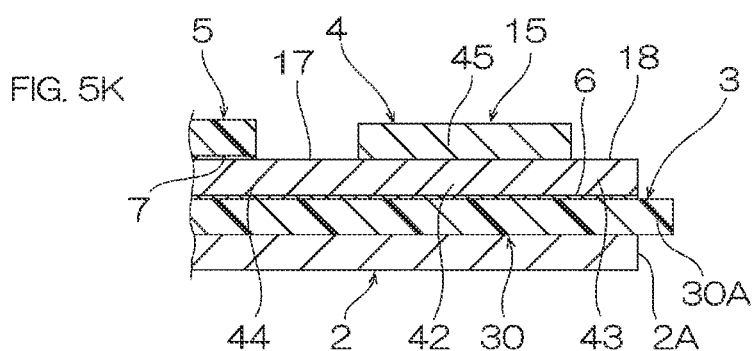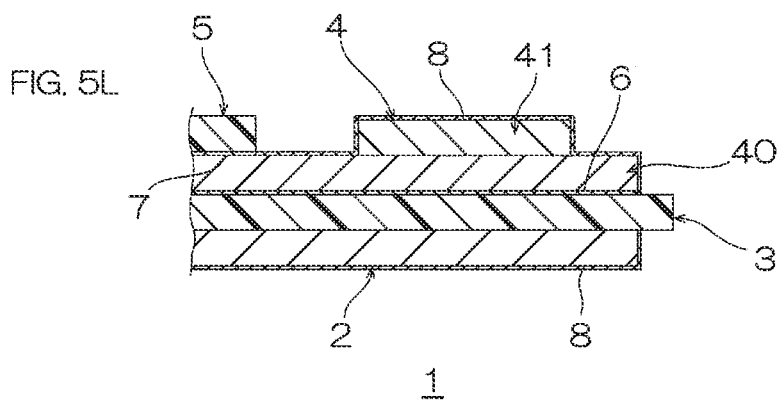

WIRING CIRCUIT BOARD

CROSS-REFERENCE TO RELATED APPLICATIONS

The present application is a 35 U.S.C. 371 National Stage Entry of: PCT/JP2020/015871, filed on Apr. 8, 2020, which claims priority from Japanese Patent Application No. 2019-092725, filed on May 16, 2019, the contents of all of which are herein incorporated by reference in their entirety.

TECHNICAL FIELD

The present invention relates to a wiring circuit board.

BACKGROUND ART

Conventionally, a wiring circuit board has been known including a metal support board, a base insulating layer disposed on the metal support board, and a conductive pattern disposed on the base insulating layer, and in which the conductive pattern includes a wiring pattern for electrically connecting two terminals, and a ground pattern for electrically connecting the terminal to the metal support board.

In such a wiring circuit board, there is a case of forming an electroless plating layer on the surface of the conductive pattern. However, a deposition rate of the electroless plating on the wiring pattern, and a deposition rate of the electroless plating on the ground pattern are different due to the presence or absence of electrical connection between the patterns and the metal support board, and it is difficult to form a uniform electroless plating layer on the conductive pattern.

Therefore, a method for producing a wiring circuit board has been proposed in which together with the wiring pattern and the ground pattern, an extension pattern for electrically connecting a terminal of the wiring pattern to the metal support board is formed, an electroless plating layer is formed on the surface of the wiring pattern and the surface of the ground pattern, and thereafter, by removing the extension pattern, the wiring pattern is insulated from the metal support board (ref: for example, Patent Document 1).

CITATION LIST

Patent Document

Patent Document 1: Japanese Unexamined Patent Publication No. 2010-171040

SUMMARY OF THE INVENTION

Problem to be Solved by the Invention

However, in the method for producing a wiring circuit board described in Patent Document 1, since the extension pattern has the same thickness as the terminal of the wiring pattern, there is a problem that it takes time to remove the extension pattern. Further, when the extension pattern is removed by etching and the like, there may be case where the terminal is eroded by over-etching, and the connection reliability of the terminal decreases.

The present invention provides a wiring circuit board capable of improving the connection reliability of a terminal portion, while capable of forming a uniform electroless plating layer on a conductive layer, and a method for producing a wiring circuit board having excellent production efficiency.

Means for Solving the Problem

The present invention [1] includes a wiring circuit board including a metal support layer, an insulating layer disposed on one side in a thickness direction of the metal support layer, and a conductive layer disposed on one side in the thickness direction of the insulating layer, and including a terminal portion and a ground lead residual portion electrically connected to the terminal portion, wherein a thickness of the ground lead residual portion is thinner than a thickness of the terminal portion.

However, in the production of the wiring circuit board, the ground lead residual portion is formed by removing a portion of a ground lead for electrically connecting the terminal portion to the metal support layer. Therefore, before the ground lead is removed, since the terminal portion is electrically connected to the metal support layer, it is possible to uniformly form an electroless plating layer on the conductive layer.

Further, according to the above-described configuration, the thickness of the ground lead residual portion is thinner than that of the terminal portion. Therefore, as compared with a case where the thickness of the ground lead residual portion is the same as that of the terminal portion, it is possible to smoothly remove the ground lead. Further, when the ground lead is removed by etching and the like, it is possible to suppress the erosion of the terminal portion by over-etching, and to improve the connection reliability of the terminal portion.

The present invention [2] includes the wiring circuit board described in the above-described [1], wherein the terminal portion includes a plurality of terminal forming layers laminated in the thickness direction, and the ground lead residual portion includes a lead forming layer continuous with at least one of the plurality of terminal forming layers.

According to such a configuration, since the terminal portion includes the plurality of terminal forming layers, and the ground lead residual portion includes the lead forming layer continuous with the terminal forming layer, it is possible to reliably make the thickness of the ground lead residual portion thinner than that of the terminal portion.

The present invention [3] includes the wiring circuit board described in the above-described [1] or [2], wherein the ground lead residual portion is located in an end portion of the wiring circuit board.

According to such a configuration, since the ground lead residual portion is located in the end portion of the wiring circuit board, in the production of the wiring circuit board, it is possible to more smoothly remove a portion of the ground lead, and to form the ground lead residual portion.

The present invention [4] includes the wiring circuit board described in any one of the above-described [1] to [3], wherein a portion of the insulating layer protrudes toward the opposite side of the terminal portion with respect to the ground lead residual portion and the metal support layer in a direction in which the ground lead residual portion extends.

According to such a configuration, since a portion of the insulating layer protrudes toward the opposite side of the terminal portion with respect to the ground lead residual portion and the metal support layer, it is possible to reliably insulate the ground lead residual portion from the metal support layer.

The present invention [5] includes the wiring circuit board described in any one of the above-described [1] to [4], wherein the ground lead residual portion is disposed on one surface in the thickness direction of the insulating layer.

According to such a configuration, since the ground lead residual portion is disposed on the insulating layer, it is possible to more reliably insulate the ground lead residual portion from the metal support layer.

The present invention [6] includes a method for producing a wiring circuit board including the steps of preparing a metal support layer, forming an insulating layer on one side in a thickness direction of the metal support layer, forming a conductive layer including a terminal portion disposed on one side in the thickness direction of the insulating layer, and a ground lead for electrically connecting the terminal portion to the metal support layer, subjecting the conductive layer to electroless plating, and removing a portion of the ground lead so as to insulate the terminal portion from the metal support layer to form a ground lead residual portion, wherein a thickness of the ground lead residual portion is thinner than a thickness of the terminal portion.

According to such a method, after forming the conductive layer including the terminal portion, and the ground lead for electrically connecting the terminal portion to the metal support layer, the conductive layer is subjected to electroless plating, and then, a portion of the ground lead is removed so as to insulate the terminal portion from the metal support layer to form the ground lead residual portion.

That is, when the conductive layer is subjected to electroless plating, since the ground lead electrically connects the terminal portion to the metal support layer, it is possible to form a uniform electroless plating layer on the conductive layer. Further, since the thickness of the ground lead residual portion is thinner than that of the terminal portion, it is possible to smoothly remove the ground lead, and to improve the connection reliability of a terminal.

The present invention [7] includes the method for producing a wiring circuit board described in the above-described [6], wherein the step of forming the conductive layer includes the steps of simultaneously forming a lead forming layer constituting the ground lead, and a terminal forming layer constituting the terminal portion and continuous with the lead forming layer, and forming the terminal forming layer constituting the terminal portion without forming the lead forming layer constituting the ground lead.

According to such a method, since the step of forming the conductive layer includes the step of simultaneously forming the lead forming layer and the terminal forming layer, and the step of forming the terminal forming layer without forming the lead forming layer, the terminal portion consists of the plurality of terminal forming layers, and the ground lead consists of the lead forming layer which has less number than the plurality of terminal forming layers.

Therefore, it is possible to reliably make the thickness of the ground lead thinner than that of the terminal portion, and thus, it is possible to reliably make the thickness of the ground lead residual portion thinner than that of the terminal portion.

The present invention [8] includes the method for producing a wiring circuit board described in the above-described [6] or [7], wherein in the step of removing a portion of the ground lead, a portion of the metal support layer and a portion of the ground lead are simultaneously etched.

According to such a method, since a portion of the metal support layer and a portion of the ground lead are simultaneously etched, it is possible to smoothly remove a portion of the ground lead, and to dispose the ground lead residual portion in the end portion of the wiring circuit board. Further, since a portion of the metal support layer and a portion of the ground lead are simultaneously etched, as compared with a case of etching them separately, it is possible to decrease the number of production steps.

The present invention [9] includes the method for producing a wiring circuit board described in any one of the above-described [6] to [8] further including after the step of forming the insulating layer, and before the step of forming the conductive layer, a step of forming a seed film on one surface in the thickness direction of the insulating layer and on one surface in the thickness direction of the metal support layer exposed from the insulating layer; after the step of forming the conductive layer, and before the step of carrying out the electroless plating, a step of removing the seed film exposed from the conductive layer: and after the step of removing a portion of the ground lead, a step of removing the seed film exposed by the removal of the ground lead.

According to such a method, after forming the seed film on the insulating layer and on the metal support layer exposed from the insulating layer, the conductive layer is formed on the seed film, followed by subjecting the conductive layer to electroless plating to form the ground lead residual portion by removing a portion of the ground lead, and then, the seed film exposed by the removal of the ground lead is removed.

However, when the seed film exposed by the removal of the ground lead remains, there is a possibility that the ground lead residual portion is electrically connected to the metal support layer via the seed film. On the other hand, according to the above-described method, since the seed film which is exposed by the removal of the ground lead is removed, it is possible to more reliably insulate the ground lead residual portion from the metal support layer.

Effect of the Invention

According to the wiring circuit board of the present invention, it is possible to improve the connection reliability of a terminal portion, while forming a uniform electroless plating layer on a conductive layer.

Further, according to the method for producing a wiring circuit board of the present invention, it is possible to efficiently produce the above-described wiring circuit board.

BRIEF DESCRIPTION OF THE DRAWINGS

FIG. 3A illustrating a step of preparing a metal support layer.

FIG. 3B illustrating a step of forming a base insulating layer,

FIG. 3C illustrating a step of forming a seed film,

FIG. 3D illustrating a step of forming a first conductive layer, and

FIG. 3E illustrating a step of forming a second conductive layer.

FIG. 4F illustrating a step of removing a seed film exposed from a conductive layer.

FIG. 4G illustrating a step of forming a first plating layer,

FIGS. 5J to 5L show production process views of the wiring circuit board subsequent to FIG. 4I:

FIG. 5J illustrating a step of forming a ground lead residual portion,

FIG. 5K illustrating a step of removing a seed film exposed by formation of the ground lead residual portion, and FIG. 5L illustrating a step of forming a second plating layer.

DESCRIPTION OF EMBODIMENTS

First Embodiment

1. Wiring Circuit Board

A wiring circuit board 1 as a first embodiment of a wiring circuit board of the present invention is described with reference to FIGS. 1 and 2.

Figure 1:
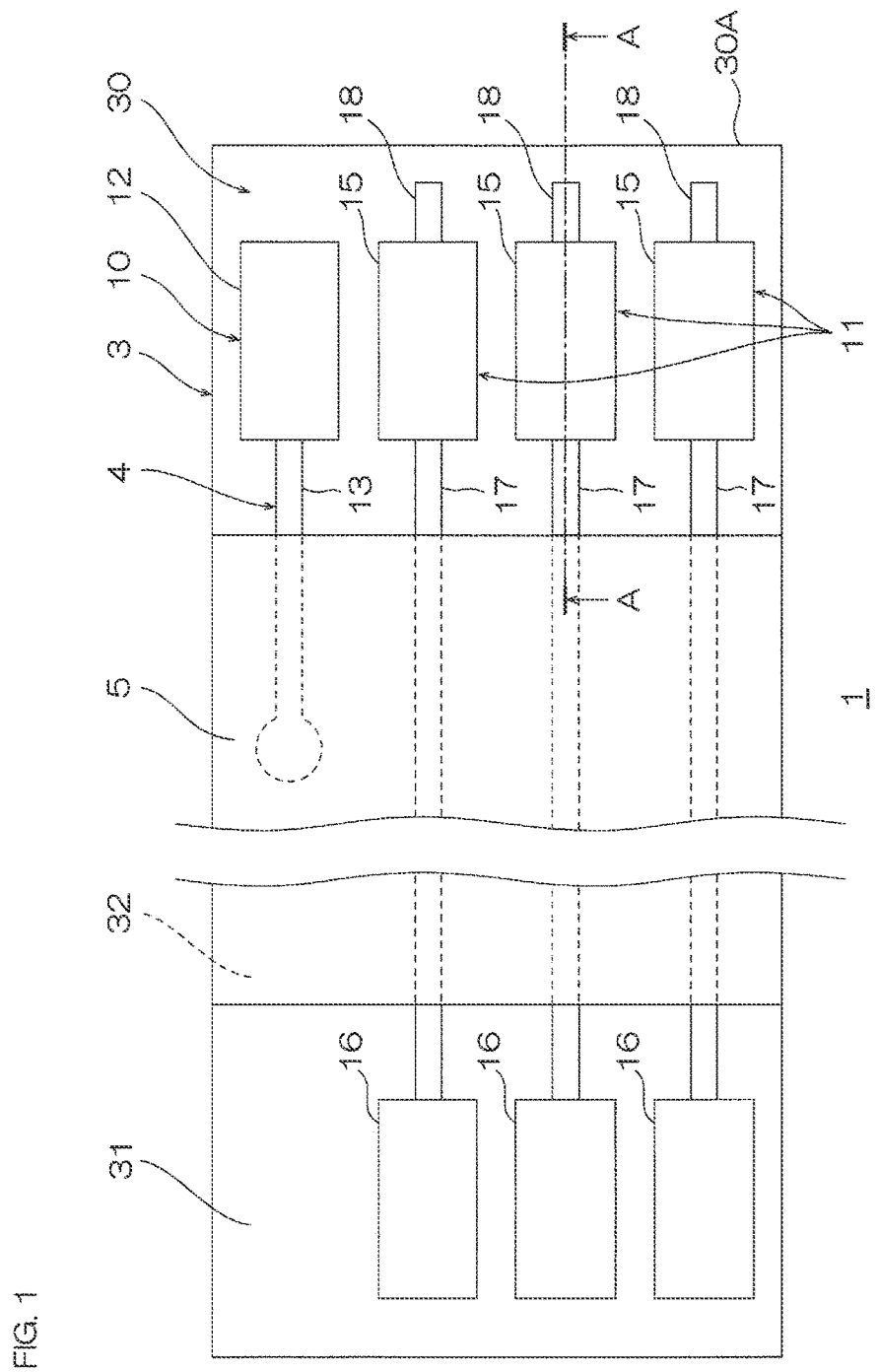
FIG. 1 shows a plan view of a first embodiment of a wiring circuit board of the present invention.
Figure 2:
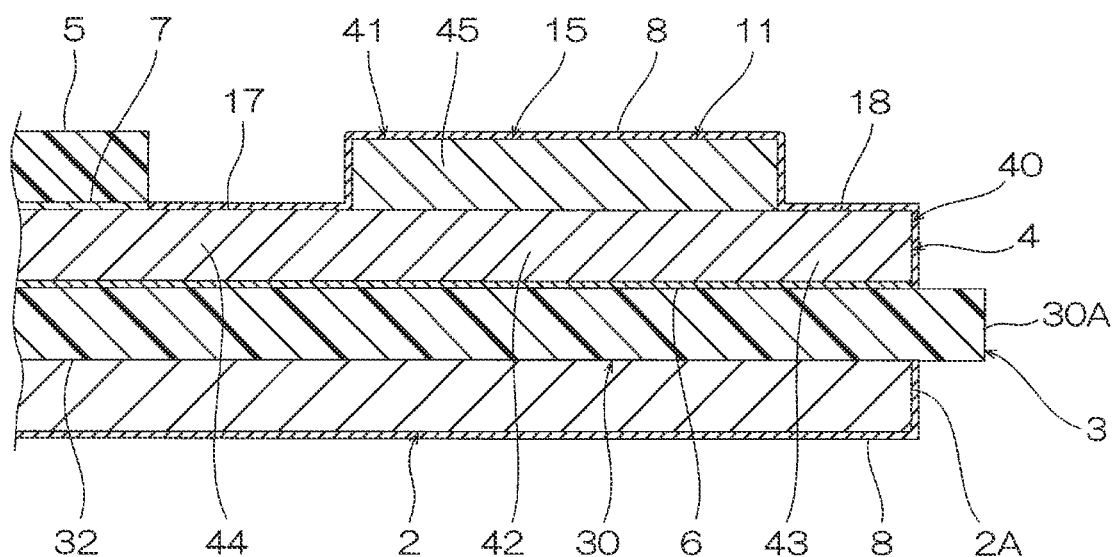
FIG. 2 shows an A-A cross-sectional view of the wiring circuit board shown in FIG. 1.

As shown in FIGS. 1 and 2, the wiring circuit board 1 has a sheet shape having a thickness. The wiring circuit board 1 has, for example, a rectangular shape w % ben in a plan view. Examples of the wiring circuit board 1 include a flexible printed wiring board with a reinforcing layer including a metal support layer 2 as a reinforcing layer, and a suspension board with a circuit including the metal support layer 2 as a suspension (spring) layer.

Specifically, as shown in FIG. 2, the wiring circuit board 1 includes the metal support layer 2, a base insulating layer 3 as one example of an insulating layer, a seed film 6, a conductive layer 4, a first plating layer 7, a cover insulating layer 5, and a second plating layer 8.

The metal support layer 2 has a flat plate shape. A thickness of the metal support layer 2 is not particularly limited.

A material for the metal support layer 2 can be, for example, appropriately selected from a known or conventional metal-based material (specifically, a metal material). Specifically, examples of the metal-based material include metal elements classified in the group 1 to group 16 in the periodic table, and alloys containing two or more metal elements. The metal element may be any of a transition metal and a typical metal.

More specifically, examples of the metal element include the group 2 metal element such as calcium, the group 4 metal element such as titanium and zirconium, the group 5 metal element such as vanadium, the group 6 metal element such as chromium, molybdenum, and tungsten, the group 7 metal element such as manganese, the group 8 metal element such as iron, the group 9 metal element such as cobalt, the group 10 metal element such as nickel and platinum, the group 11 metal element such as copper, silver, and gold, the group 12 metal element such as zinc, the group 13 metal element such as aluminum and gallium, and the group 14 metal element such as germanium and tin.

These metal-based materials may be used alone or in combination of two or more. Of the metal-based materials, preferably, an alloy containing two or more metal elements is used, more preferably, an alloy which can be etched simultaneously with the conductive layer 4 is used, particularly preferably, an alloy containing stainless, steel, and copper is used.

The base insulating layer 3 is disposed on one side in a thickness direction of the metal support layer 2, and specifically, on one surface in the thickness direction of the metal support layer 2. The base insulating layer 3 has the same outer shape as the wiring circuit board 1. The base insulating layer 3 has a thickness, and has flat one surface and the flat other surface in the thickness direction.

As shown in FIG. 1, the base insulating layer 3 includes a first terminal disposed portion 30, a second terminal disposed portion 31, and a wiring disposed portion 32. The first terminal disposed portion 30 and the second terminal disposed portion 31 are located at spaced intervals to each other so as to sandwich the wiring disposed portion 32 therebetween. The first terminal disposed portion 30 is continuous with the wiring disposed portion 32. The first terminal disposed portion 30 has a free end portion 30A located on the opposite side of the wiring disposed portion 32. The free end portion 30A protrudes toward the opposite side of the wiring disposed portion 32 with respect to an end surface 2A of the metal support layer 2 (ref: FIG. 2).

The second terminal disposed portion 31 is located on the opposite side of the first terminal disposed portion 30 with respect to the wiring disposed portion 32. The second terminal disposed portion 31 is continuous with the wiring disposed portion 32. Each of the first terminal disposed portion 30 and the second terminal disposed portion 31 is not covered with the cover insulating layer 5, and is exposed from the cover insulating layer 5. The wiring disposed portion 32C is located between the first terminal disposed portion 30 and the second terminal disposed portion 31. The wiring disposed portion 32C is covered with the cover insulating layer 5.

Examples of a material for the base insulating layer 3 include resins (insulating resin materials) such as polyimide. A thickness of the base insulating layer 3 is not particularly limited, and is, for example, 1 μm or more, and 1000 μm or less.

As shown in FIG. 2, the seed film 6 is disposed on one surface in the thickness direction of the base insulating layer 3. The seed film 6 has a pattern corresponding to the conductive layer 4. Examples of a material for the seed film 6 include metals such as copper, chromium, and nickel, and alloys of these. The seed film 6 may be formed of one layer, or two or more layers. A thickness of the seed film 6 is, for example, 0.01 μm or more, and for example, 1 μm or less, preferably 0.1 μm or less.

The conductive layer 4 is disposed on one side in the thickness direction of the base insulating layer 3, and specifically, on one surface in the thickness direction of the seed film 6. As shown in FIG. 1, the conductive layer 4 includes a ground pattern 10 and a plurality of wiring patterns 11.

The ground pattern 10 includes a ground terminal 12 and a ground wiring 13.

The ground terminal 12 is disposed on one side in the thickness direction of the first terminal disposed portion 30. Specifically, the ground terminal 12 is disposed on one surface in the thickness direction of the first terminal disposed portion 30 via the seed film 6. The ground terminal 12 has a rectangular (square land) shape when extending in a predetermined direction in a plan view.

The ground wiring 13 electrically connects the ground terminal 12 to the metal support layer 2. The ground wiring 13 is continuous from the ground terminal 12 to extend from the first terminal disposed portion 30 until the wiring disposed portion 32C. Specifically, the ground wiring 13 is disposed over one surface in the thickness direction of the first terminal disposed portion 30 and one surface in the thickness direction of the wiring disposed portion 32 via the seed film 6. The ground wiring 13 penetrates through the wiring disposed portion 32C in the thickness direction to be grounded to the metal support layer 2. A dimension in a width direction (direction perpendicular to a longitudinal direction) of the ground wiring 13 is smaller than that in the width direction (direction perpendicular to the longitudinal direction) of the ground terminal 12.

Each of the plurality of wiring patterns 11 includes a first terminal 15 as one example of a terminal portion, a second terminal 16, a connection wiring 17, and a ground lead residual portion 18. That is, the conductive layer 4 includes the plurality of first terminals 15, and the plurality of ground lead residual portions 18.

The first terminal 15 is disposed on one side in the thickness direction of the first terminal disposed portion 30. Specifically, the first terminal 15 is disposed on one surface in the thickness direction of the first terminal disposed portion 30 via the seed film 6 (ref: FIG. 2). The first terminal 15 has a rectangular (square land) shape extending in a predetermined direction in a plan view. The plurality of first terminals 15 and the ground terminal 12 are disposed at spaced intervals to each other in the width direction (direction perpendicular to the longitudinal direction) of the first terminal 15.

The second terminal 16 is disposed on one side in the thickness direction of the second terminal disposed portion 31. Specifically, the second terminal 16 is disposed on one surface in the thickness direction of the second terminal disposed portion 31 via the seed film 6. The second terminal 16 has a rectangular (square land) shape extending in a predetermined direction in a plan view. The plurality of second terminals 16 are disposed at spaced intervals to each other in the width direction (direction perpendicular to the longitudinal direction) of the second terminal 16.

The connection wiring 17 electrically connects the first terminal 15 to the second terminal 16. The connection wiring 17 extends on the first terminal disposed portion 30 continuously from the first terminal 15, then, passes over the wiring disposed portion 32C, and is connected to the second terminal 16 on the second terminal disposed portion 31. Specifically, the connection wiring 17 is disposed over one surface in the thickness direction of the first terminal disposed portion 30, one surface in the thickness direction of the wiring disposed portion 32, and one surface in the thickness direction of the second terminal disposed portion 31 via the seed film 6. A dimension in the width direction (direction perpendicular to the longitudinal direction) of the connection wiring 17 is smaller than that in the width direction (direction perpendicular to the longitudinal direction) of the first terminal 15.

The ground lead residual portion 18 is a residual portion of a ground lead 19 obtained by removing a portion of the ground lead 19 in a method for producing the wiring circuit board 1 to be described later (ref: FIG. 5). The ground lead residual portion 18 is disposed on one side in the thickness direction of the first terminal disposed portion 30 (ref: FIG. 2). Specifically, the ground lead residual portion 18 is disposed on one surface in the thickness direction of the first terminal disposed portion 30 via the seed film 6. The ground lead residual portion 18 is electrically connected to the first terminal 15. The ground lead residual portion 18 is continuous from the first terminal 15 to extend toward the opposite side of the connection wiring 17. The ground lead residual portion 18 is located in the end portion of the wiring circuit board 1. The ground lead residual portion 18 is located at the side of the first terminal 15 at spaced intervals thereto with respect to the end surface of the free end portion 30A of the first terminal disposed portion 30. That is, the free end portion 30A of the first terminal disposed portion 30 protrudes toward the opposite side of the first terminal 15 with respect to the ground lead residual portion 18 and the metal support layer 2 in a direction in which the ground lead residual portion 18 extends.

A thickness of the ground lead residual portion 18 is thinner than that of the first terminal 15. When the thickness of the first terminal 15 is defined as 100, the thickness of the ground lead residual portion 18 is, for example, 1 or more, preferably 5 or more, and for example, 90 or less, preferably 80 or less.

Specifically, the thickness of the ground lead residual portion 18 is, for example, 1 μm or more, and for example, 200 μm or less, preferably 100 μm or less, further more preferably 50 μm or less. The thickness of the first terminal 15 is, for example, 10 μm or more, preferably 20 μm or more, and for example, 300 μm or less, preferably 200 μm or less.

As shown in FIG. 2, the conductive layer 4 consists of a plurality of layers. In the present embodiment, the conductive layer 4 includes a first conductive layer 40 and a second conductive layer 41. The number of layers constituting the conductive layer 4 is not particularly limited, and may be three or more.

The first conductive layer 40 is disposed on one surface in the thickness direction of the seed film 6. The first conductive layer 40 includes a plurality of first terminal forming layers 42 as one example of a terminal forming layer, a plurality of lead forming layers 43, and a plurality of wiring forming layers 44.

The first terminal forming layer 42 constitutes the first terminal 15. The lead forming layer 43 is continuous with the first terminal forming layer 42 to constitute the ground lead residual portion 18. The wiring forming layer 44 is continuous with the first terminal forming layer 42 to constitute the connection wiring 17.

A thickness of the first conductive layer 40 is, for example, the same as that of the ground lead residual portion 18 described above.

The second conductive layer 41 is disposed on one surface in the thickness direction of the first conductive layer 40. The second conducive layer 41 includes a plurality of second terminal forming layers 45 as one example of a terminal forming layer.

The second terminal forming layer 45 constitutes the first terminal 15. The second terminal forming layer 45 is disposed on one surface in the thickness direction of the first terminal forming layer 42. That is, the first terminal forming layer 42 and the second terminal forming layer 45 are laminated in the thickness direction.

When the thickness of the first conductive layer 40 is defined as 100, a thickness of the second conductive layer 41 is, for example, 1 or more, preferably 5 or more, and for example, 1000 or less, preferably 500 or less. Specifically, the thickness of the second conductive layer 41 is, for example, 1 μm or more, and for example, 200 μm or less, preferably 100 μm or less.

Although not shown, the first conductive layer 40 further includes a ground terminal forming layer constituting the ground terminal 12, a ground wiring forming layer constituting the ground wiring 13, and a third terminal forming layer constituting the plurality of second terminals 16.

In the present embodiment, as described above, the first terminal 15 includes a plurality of first terminal forming layers laminated in the thickness direction (the first terminal forming layer 42 and the second terminal forming layer 45), and preferably, consists of the first terminal forming layer 42 and the second terminal forming layer 45. The number of layers of the terminal forming layer provided in the first terminal 15 is not particularly limited, and it may be three or more.

Further, the ground lead residual portion 18 includes the lead forming layer 43 continuous with the first terminal forming layer 42, and preferably, consists of the lead forming layer 43. The number of layers of the lead forming layer provided in the ground lead residual portion 18 is not particularly limited as long as it is below the number of layers of the terminal forming layer provided in the first terminal 15, and it may be two or more.

Further, the connection wiring 17 includes the wiring forming layer 44 continuous with the first terminal forming layer 42, and preferably, consists of the wiring forming layer 44. The number of layers of the wiring forming layer provided in the connection wiring 17 is not particularly limited, and it may be two or more.

Examples of a material for the conductive layer 4 (the first conductive layer 40 and the second conductive layer 41) include metal elements such as copper, silver, gold, iron, aluminum, and chromium, and metals such as alloys containing two or more metal elements, and preferably, a metal containing copper such as copper and copper alloy is used.

The first plating layer 7 improves the adhesive properties between the conductive layer 4 and the cover insulating layer 5. The first plating layer 7 is an electroless plating layer, and located between the conductive layer 4 and the cover insulating layer 5. Specifically, the first plating layer 7 is provided so as to cover the surfaces of the ground wiring 13 and the connection wiring 17 located on the wiring disposed portion 32. Examples of a material for the first plating layer 7 include metal elements such as nickel, tin, silver, and palladium, and metals such as alloys containing two or more metal elements, and preferably, nickel is used. The first plating layer 7 may be formed of one layer, or two or more layers. A thickness of the first plating layer 7 is, for example, 0.01 μm or more, preferably 0.02 μm or more, and for example, 1 μm or less, preferably 0.5 μm or less.

The cover insulating layer 5 is disposed on one surface in the thickness direction of the wiring disposed portion 32 so as to cover the ground wiring 13 and the connection wiring 17. Further, the cover insulating layer 5 exposes the ground terminal 12, the plurality of first terminals 15, the plurality of ground lead residual portions 18, and the plurality of second terminals 16 (ref: FIG. 1). An example of a material for the cover insulating layer 5 includes the same material for the base insulating layer 3. A thickness of the cover insulating layer 5 is not particularly limited, and is, for example, 1 μm or more, and 1000 μm or less.

The second plating layer 8 is an electroless plating layer, and is provided so as to cover the surface of the conductive layer 4 exposed from the cover insulating layer 5 (specifically, the ground terminal 12, the plurality of first terminals 15, the plurality of ground lead residual portions 18, and the plurality of second terminals 16), and the surface of the metal support layer 2. Examples of a material for the second plating layer 8 include metal elements such as nickel and gold, and alloys containing the metal elements. The second plating layer 8 may be formed of one layer, or two or more layers. The second plating layer 8 may be, for example, formed by laminating a first layer containing nickel and a second layer containing gold. A thickness of the second plating layer 8 is, for example, 0.1 μm or more, preferably 0.25 μm or more, and for example, 5 μm or less, preferably 2.5 μm or less.

2. Producing Method of Wiring Circuit Board

Next, a method for producing the wiring circuit board 1 is described with reference to FIGS. 3A to 6.

Figure 3A:
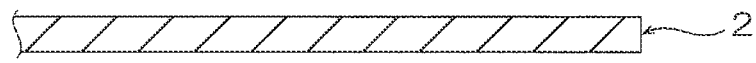
FIGS. 3A to 3E show production process views of the wiring circuit board shown in FIG. 2.
Figure 3B:
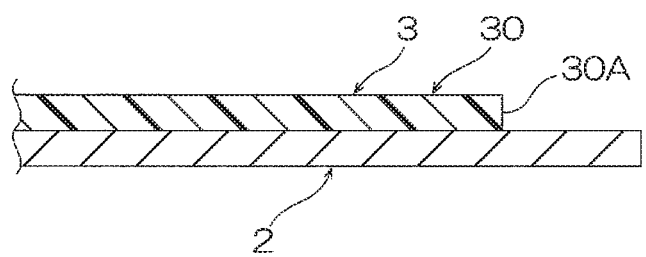
Figure 3C:
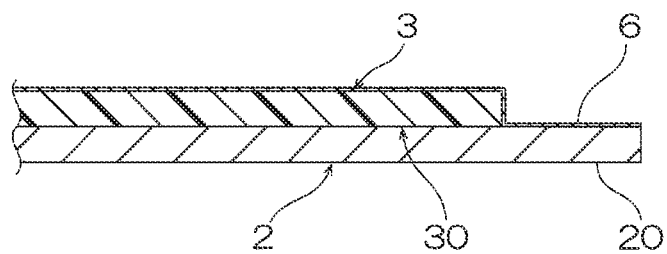
Figure 3D:
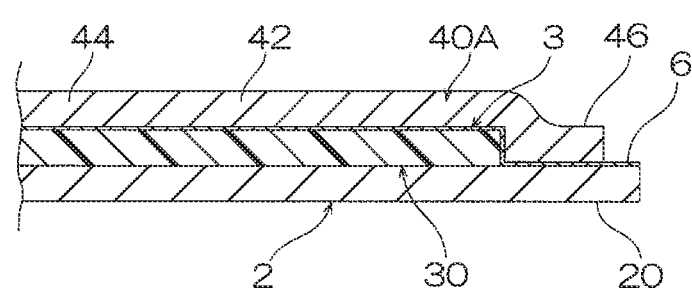
Figure 3E:
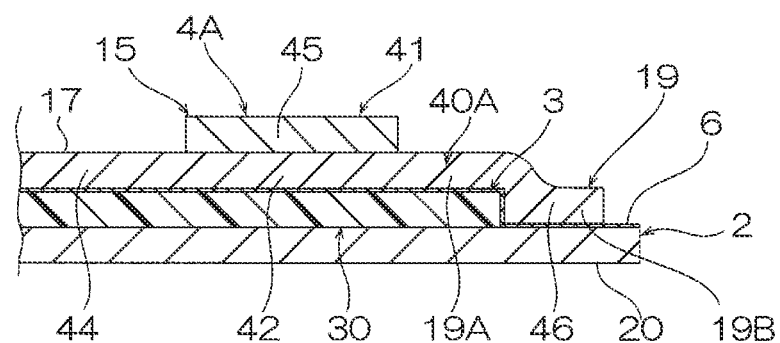

A method for producing the wiring circuit board 1 includes a step of preparing the metal support layer 2 (ref: FIG. 3A), a step of forming the base insulating layer 3 (ref: FIG. 3B), a step of forming the seed film 6 (ref: FIG. 3C), a step of forming a conductive layer 4A (ref: FIGS. 3D and 3E), a step of removing the seed film 6 exposed from the conductive layer 4A (ref FIG. 4F), a step of forming the first plating layer 7 (ref: FIG. 4G), a step of forming the cover insulating layer 5 (ref: FIG. 4H), a step of removing the first plating layer 7 exposed from the cover insulating layer 5 (ref: FIG. 4I), a step of forming the ground lead residual portion 18 (ref: FIG. 5J), a step of removing the seed film 6 exposed by the formation of the ground lead residual portion 18 (ref: FIG. 5K), and a step of forming the second plating layer 8 (ref: FIG. 5L).

As shown in FIG. 3A, first, the metal support layer 2 is prepared.

Then, as shown in FIG. 3B, the base insulating layer 3 is formed on one side in the thickness direction of the metal support layer 2. Specifically, a varnish containing the above-described resin is applied to one surface in the thickness direction of the metal support layer 2 and dried to form a base film. Thereafter, the base film is exposed to light via a photomask which is not shown to be developed, and cured by heating as necessary to form the base insulating layer 3 into the above-described pattern.

In the base insulating layer 3, the free end portion 30A of the first terminal disposed portion 30 is located inside the wiring circuit board 1 with respect to the peripheral end surface of the metal support layer 2. Therefore, a portion of one surface in the thickness direction of the metal support layer 2 is exposed from the base insulating layer 3. In the following, the portion of the metal support layer 2 exposed from the base insulating layer 3 is referred to as a ground portion 20.

Then, as shown in FIG. 3C, the seed film 6 is formed on one surface in the thickness direction of the base insulating layer 3, and on one surface in the thickness direction of the ground portion 20 (the metal support layer 2 exposed from the base insulating layer 3). Examples of a method for forming the seed film 6 include sputtering, electrolytic plating, and electroless plating, and preferably, sputtering is used.

Figure 6:
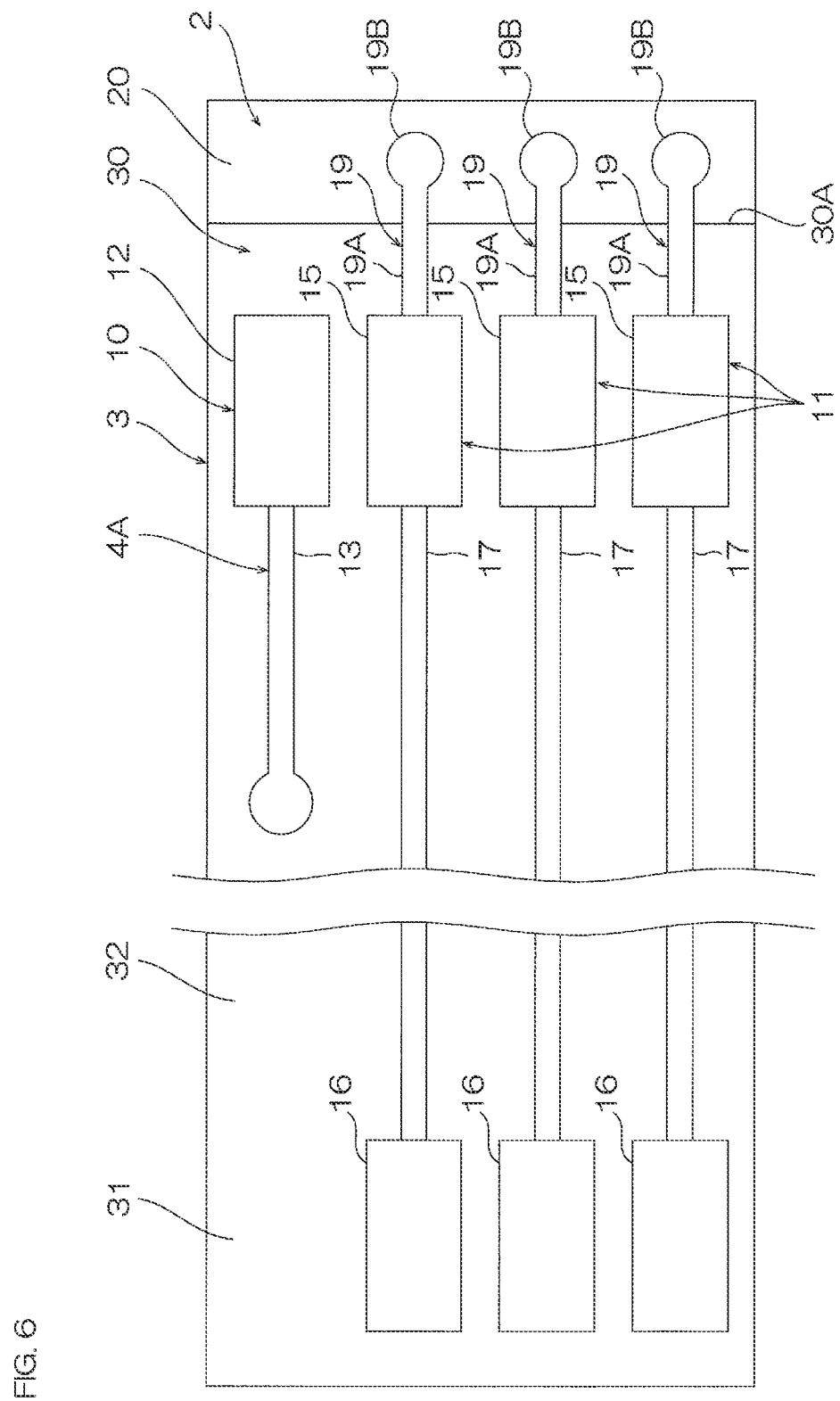
FIG. 6 shows a plan view of a conductive layer including a ground lead shown in FIG. 3E.

Then, as shown in FIGS. 3D and 3E, the conductive layer 4A is formed on one surface in the thickness direction of the seed film 6. As shown in FIG. 6, the conductive layer 4A has the same configuration as that of the conductive layer 4, except that the plurality of ground leads 19 are provided instead of the plurality of ground lead residual portions 18. In the following, the conductive layer 4A including the ground lead 19 is distinguished from the conductive layer 4 including the ground lead residual portion 18 as a pre-conductive layer 4A.

The ground lead 19 electrically connects the first terminal 15 to the ground portion 20. The ground lead 19 is continuous from the first terminal 15 to extend toward the opposite side of the connection wiring 17, and passes over the free end portion 30A of the first terminal disposed portion 30 to be located on the ground portion 20. The ground lead 19 is located in the end portion of the pre-conductive layer 4A. The ground lead 19 includes a first portion 19A and a second portion 19B.

The first portion 19A is located on one side in the thickness direction of the first terminal disposed portion 30, and in particular, disposed on one surface in the thickness direction of the first terminal disposed portion 30 via the seed film 6 (ref: FIG. 3E). The first portion 19A is continuous with the first terminal 15. The second portion 19B electrically connects the first portion 19A to the ground portion 20. The second portion 19B is continuous with the first portion 19A, and located on one side in the thickness direction of the ground portion 20. Specifically, the second portion 19B is in contact with one surface in the thickness direction of the ground portion 20 via the seed film 6 (ref: FIG. 3E).

To form the pre-conductive layer 4A, as shown in FIGS. 3D and 3E, after forming the first conductive layer 40A on one surface in the thickness direction of the seed film 6, the second conductive layer 41 is formed on one surface in the thickness direction of the first conductive layer 40A.

To form the first conductive layer 40A, though not shown, a resist having a reversed pattern of the first conductive layer 40A is disposed on the seed film 6 to be subjected to, for example, electrolytic plating (preferably, electrolytic copper plating). Thereafter, the resist is removed.

The first conductive layer 40A has the same configuration as that of the first conductive layer 40, except that it includes a plurality of lead forming layers 46 instead of the plurality of lead forming layers 43. The lead forming layer 46 is continuous with the first terminal forming layer 42 to constitute the ground lead 19. In other words, in the formation of the first conductive layer 40A, the lead forming layer 46 constituting the ground lead 19, and the first terminal forming layer 42 constituting the first terminal 15 and continuous with the lead forming layer 46 are simultaneously formed.

Then, as shown in FIG. 3E, the second conductive layer 41 is formed. To form the second conductive layer 41, though not shown, a resist having a reversed pattern of the second conductive layer 41 is disposed on the first conductive layer 40A to be subjected to, for example, electrolytic plating (preferably, electrolytic copper plating). Thereafter, the resist is removed.

Thus, the second terminal forming layer 45 constituting the first terminal 15 is formed without forming the lead forming layer constituting the ground lead 19. The second terminal forming layer 45 is formed on one surface in the thickness direction of the first terminal forming layer 42, and the first terminal 15 is formed.

Thus, the pre-conductive layer 4A including the first terminal 15 and the ground lead 19 is formed.

Figure 4F:
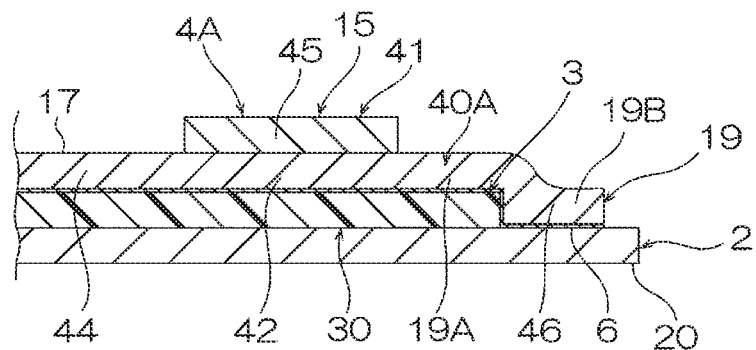
FIGS. 4F to 4G show production process views of the wiring circuit board subsequent to FIG. 3E.
Figure 4G:
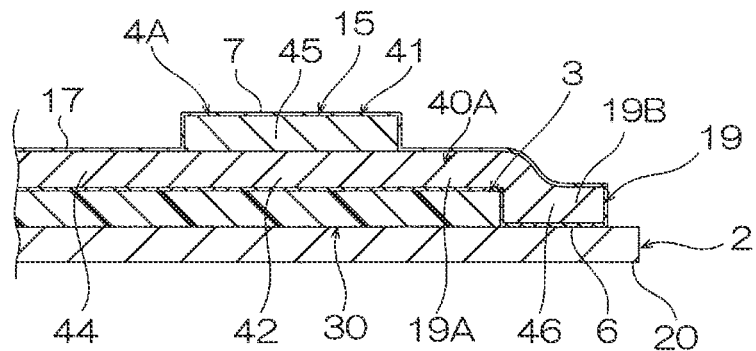
Figure 4H:
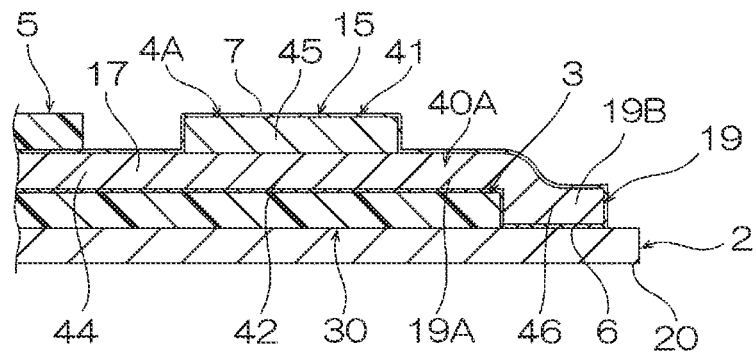
FIG. 4H illustrating a step of forming a cover insulating layer.
Figure 4I:
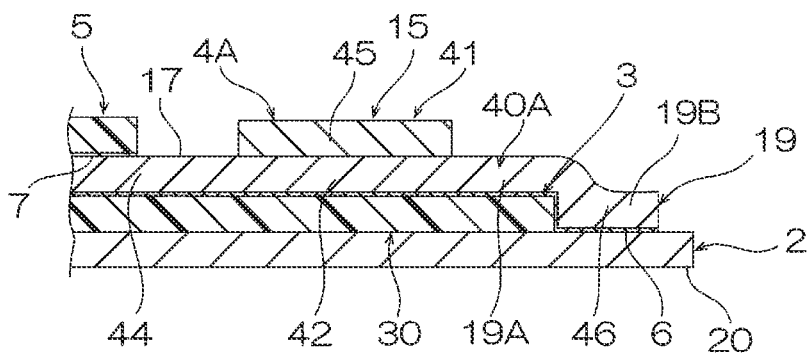
FIG. 4I illustrating a step of removing the first plating layer exposed from the cover insulating layer.

Then, as shown in FIG. 4F, the seed film 6 exposed from the pre-conductive layer 4A is removed by known etching (for example, wet etching and the like). Examples of an etching solution of the seed film 6 include a caustic soda aqueous solution, a potassium permanganate solution, and a sodium metasilicate solution.

Then, as shown in FIG. 4G the pre-conductive layer 4A is subjected to electroless plating using a first electroless plating solution containing metal ions (for example, nickel ions) of the material for the first plating layer 7 described above.

Thus, the first plating layer 7 is formed so as to cover the exposed pre-conductive layer 4A (the ground terminal 12, the ground wiring 13, the first terminal 15, the second terminal 16, the connection wiring 17, and the ground lead 19).

Next, as shown in FIG. 4H, the cover insulating layer 5 is formed on one side in the thickness direction of the base insulating layer 3, specifically, on one surface in the thickness direction of the wiring disposed portion 32 so as to cover the ground wiring 13 and the connection wiring 17. The cover insulating layer 5 is formed into the above-described pattern.

Specifically, a varnish containing the above-described resin is applied to one surface in the thickness direction of the base insulating layer 3 and dried to form a cover film. Thereafter, the cover film is exposed to light via a photomask which is not shown to be developed, and cured by heating as necessary to form the cover insulating layer 5 into the above-described pattern.

Then, as shown in FIG. 4I, the first plating layer 7 exposed from the cover insulating layer 5 is removed by known etching (for example, wet etching and the like). Examples of an etching solution of the first plating layer 7 include sulfuric acid and hydrogen peroxide, and pemitric acid water.

Next, as shown in FIG. 5J, the ground portion 20 of the metal support layer 2 and the second portion 19B of the ground lead 19 are simultaneously etched so that the first terminal 15 is insulated from the metal support layer 2 to remove a portion of the ground lead 19. Specifically, the ground portion 20 and the second portion 19B are simultaneously removed by wet etching. An example of an etching solution includes a ferric chloride solution.

At this time, after removing the ground portion 20, the etching solution further etches the metal support layer 2 so that the end surface 2A of the metal support layer 2 is located on the side of the first terminal 15 with respect to the free end portion 30A of the first terminal disposed portion 30. Also, after removing the second portion 19B, the etching solution further etches the ground lead 19 until the end surface of the first portion 19A is located on the side of the first terminal 15 with respect to the free end portion 30A.

Thus, the ground lead residual portion 18 is formed, and the free end portion 30A of the first terminal disposed portion 30 protrudes toward the opposite side of the first terminal 15 with respect to the ground lead residual portion 18 and the metal support layer 2.

Next, as shown in FIG. 5K, the seed film 6 exposed by removal of the ground lead 19 is removed. Specifically, the seed film 6 located on the free end portion 30A is removed by known etching (for example, wet etching and the like).

Then, as shown in FIG. 5L, the conductive layer 4 exposed from the cover insulating layer 5 (specifically, the ground terminal 12, the first terminal 15, the ground lead residual portion 18, and the second terminal 16) and the metal support layer 2 are subjected to electroless plating using a second electroless plating solution containing the metal ions of the material for the second plating layer 8 described above. When the second plating layer 8 is formed of a plurality of layers, the electroless plating is repeated. For example, after the electroless plating using the second electroless plating solution containing the first metal ions (for example, nickel ions), the electroless plating is carried out using the second electroless plating solution containing the second metal ions (for example, gold ions).

Thus, the second plating layer 8 is formed so as to cover the exposed conductive layer 4 (specifically, the ground terminal 12, the first terminal 15, the ground lead residual portion 18, and the second terminal 16) and the metal support layer 2.

Thus, the wiring circuit board 1 is produced.

The application of the wiring circuit board 1 is not particularly limited, and the wiring circuit board 1 is used in various fields. The wiring circuit board 1 is, for example, used for various applications such as a wiring circuit board for an electronic device (wiring circuit board for an electronic component) and a wiring circuit board for an electric device (wiring circuit board for an electric component). Examples of the wiring circuit board for an electronic device and the wiring circuit board for an electric device include a wiring circuit board for a sensor used for sensors such as a position information sensor, an obstacle detection sensor, and a temperature sensor; a wiring circuit board for a transport vehicle used for transport vehicles such as an automobile, a train, an aircraft, and a working vehicle; a wiring circuit board for a video device used for video devices such as a flat panel display, a flexible display, and a projection video device; a wiring circuit board for a communication relay device used for communication relay devices such as a network device and a large communication device; a wiring circuit board for an information processing terminal used for information processing terminals such as a computer, a tablet, a smartphone, and a video game; a wiring circuit board for a movable device used for movable devices such as a drone and a robot; a wiring circuit board for medical equipment used for medical equipments such as wearable medical equipment and medical diagnostic equipment; a wiring circuit board for an electric device used for electric devices such as a refrigerator, a washing machine, a vacuum cleaner, and an air conditioning machine; and a wiring circuit board for a recording electronic device used for recording electronic devices such as a digital camera and a DVD recording device.

As shown in FIG. 1, the ground lead residual portion 18 is formed by removing a portion of the ground lead 19 for electrically connecting the first terminal 15 to the metal support layer 2 in the production of the wiring circuit board 1 (ref: FIG. 5J). Therefore, before removing the ground lead 19, since the first terminal 15 is electrically connected to the metal support layer 2, it is possible to uniformly form the first plating layer 7 on the conductive layer 4.

Further, as shown in FIG. 2, the thickness of the ground lead residual portion 18 is thinner than that of the first terminal 15. Therefore, it is possible to smoothly remove the ground lead 19.

A method for etching a portion of the ground lead 19 is not particularly limited, and it may be wet etching or dry etching. However, in a case where a portion of the ground lead 19 is removed by wet etching, when the thickness of the ground lead residual portion 18 is not less than that of the first terminal 15, a portion of the ground lead 19 may not be sufficiently removed.

In this regard, in the wiring circuit board 1, since the thickness of the ground lead residual portion 18 is thinner than that of the first terminal 15, it is also possible to reliably remove a portion of the ground lead 19 by wet etching, and to suppress the erosion of the first terminal 15 by overetching, and thus, it is possible to improve the connection reliability of the first terminal 15.

As shown in FIG. 2, the first terminal 15 includes the first terminal forming layer 42 and the second terminal forming layer 45, and the ground lead residual portion 18 includes the lead forming layer 43 continuous with the first terminal forming layer 42. Therefore, it is possible to reliably make the thickness of the ground lead residual portion 18 thinner than that of the first terminal 15. Further, since the first terminal forming layer 42 and the lead forming layer 43 are continuous with each other, it is possible to improve the reliability of the electrical conduction between the first terminal forming layer 42 and the lead forming layer 43.

As shown in FIG. 1, the ground lead residual portion 18 is located in the end portion of the wiring circuit board 1. Therefore, in the production of the wiring circuit board 1, it is possible to more smoothly remove a portion of the ground lead 19, and to form the ground lead residual portion 18.

As shown in FIG. 2, the ground lead residual portion 18 is disposed on the first terminal disposed portion 30, and the free end portion 30A of the first terminal disposed portion 30 protrudes toward the opposite side of the first terminal 15 with respect to the ground lead residual portion 18 and the metal support layer 2 in a direction in which the ground lead residual portion 18 extends. Therefore, it is possible to reliably insulate the ground lead residual portion 18 from the metal support layer 2.

Further, as shown in FIGS. 4F to 5J, in the method for producing the wiring circuit board 1, after forming the pre-conductive layer 4A including the first terminal 15 and the ground lead 19 (ref: FIG. 4F), the pre-conductive layer 4A is subjected to electroless plating (ref: FIG. 4G), and then, the second portion 19B of the ground lead 19 is removed so that the first terminal 15 is insulated from the metal support layer 2 to form the ground lead residual portion 18 (ref: FIG. 5J).

That is, when the pre-conductive layer 4A is subjected to electroless plating, since the ground lead 19 electrically connects the first terminal 15 to the metal support layer 2, it is possible to form the uniform first plating layer 7 on the pre-conductive layer 4A. Further, since the thickness of the ground lead residual portion 18 is thinner than that of the first terminal 15, it is possible to improve the connection reliability of the first terminal 15, while smoothly removing the ground lead 19.

Further, as shown in FIGS. 3D and 3E, the step of forming the conductive layer 4 includes the step of simultaneously forming the lead forming layer 46 and the first terminal forming layer 42, and the step of forming the second terminal forming layer 45 without forming the lead forming layer. Therefore, the first terminal 15 consists of a plurality of terminal forming layers, and the ground lead 19 consists of lead forming layers which has less number than the plurality of terminal forming layers. Therefore, it is possible to reliably make the thickness of the ground lead 19 thinner than that of the first terminal 15, and thus, to reliably make the thickness of the ground lead residual portion 18 thinner than that of the first terminal 15.

Further, as shown in FIG. 5J, the ground portion 20 of the metal support layer 2 and the second portion 19B of the ground lead 19 are simultaneously etched. Therefore, it is possible to smoothly remove the second portion 19B of the ground lead 19, and to dispose the ground lead residual portion 18 in the end potion of the wiring circuit board 1, and it is possible to decrease the number of production steps. It is also possible to separately carry out the etching of the metal support layer 2, and the etching of the ground lead 19.

Further, as shown in FIG. 5K, the seed film 6 exposed by the removal of the ground lead 19 is removed. Therefore, it is possible to more reliably insulate the ground lead residual portion 18 from the metal support layer 2.

Second Embodiment

Next, a second embodiment of the wiring circuit board of the present invention is described with reference to FIG. 7. In the second embodiment, the same reference numerals are provided for members corresponding to each of those in the above-described first embodiment, and their detailed description is omitted.

In the above-described first embodiment, as shown in FIG. 2, the first conductive layer 40 includes the first terminal forming layer 42, the lead forming layer 43, and the wiring forming layer 44, and the second conductive layer 41 includes the second terminal forming layer 45. However, the configuration of the conductive layer 4 is not limited to this.

Figure 7:
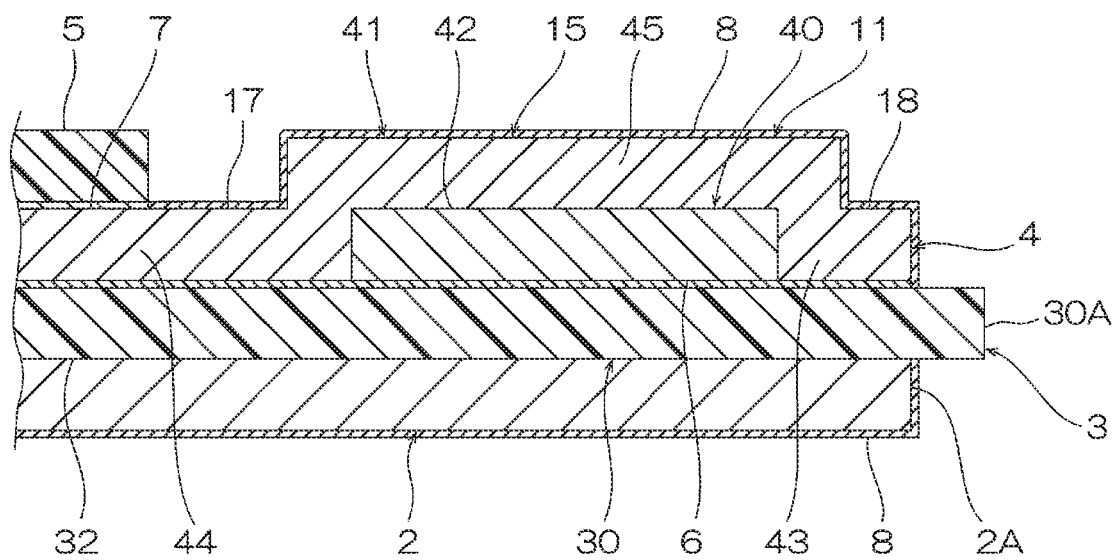
FIG. 7 shows a side cross-sectional view of a second embodiment of a wiring circuit board of the present invention.

In the second embodiment, as shown in FIG. 7, the first conductive layer 40 includes the first terminal forming layer 42, and the second conductive layer 41 includes the second terminal forming layer 45, the lead forming layer 43, and the wiring forming layer 44. In this case, the lead forming layer 43 is continuous with the second terminal forming layer 45 without being continuous with the first terminal forming layer 42. The wiring forming layer 44 is continuous with the second terminal forming layer 45 without being continuous with the first terminal forming layer 42.

In the second embodiment, the same function and effect as that of the above-described first embodiment can be achieved.

Third Embodiment

Next, a third embodiment of the wiring circuit board of the present invention is described with reference to FIGS. 8 and 9. In the third embodiment, the same reference numerals are provided for members corresponding to each of those in the above-described first embodiment, and their detailed description is omitted.

In the above-described first embodiment, as shown in FIG. 2, the ground lead residual portion 18 consists of only a portion to be continuous with the first terminal 15. However, the configuration of the ground lead residual portion is not limited to this.

Figure 8:
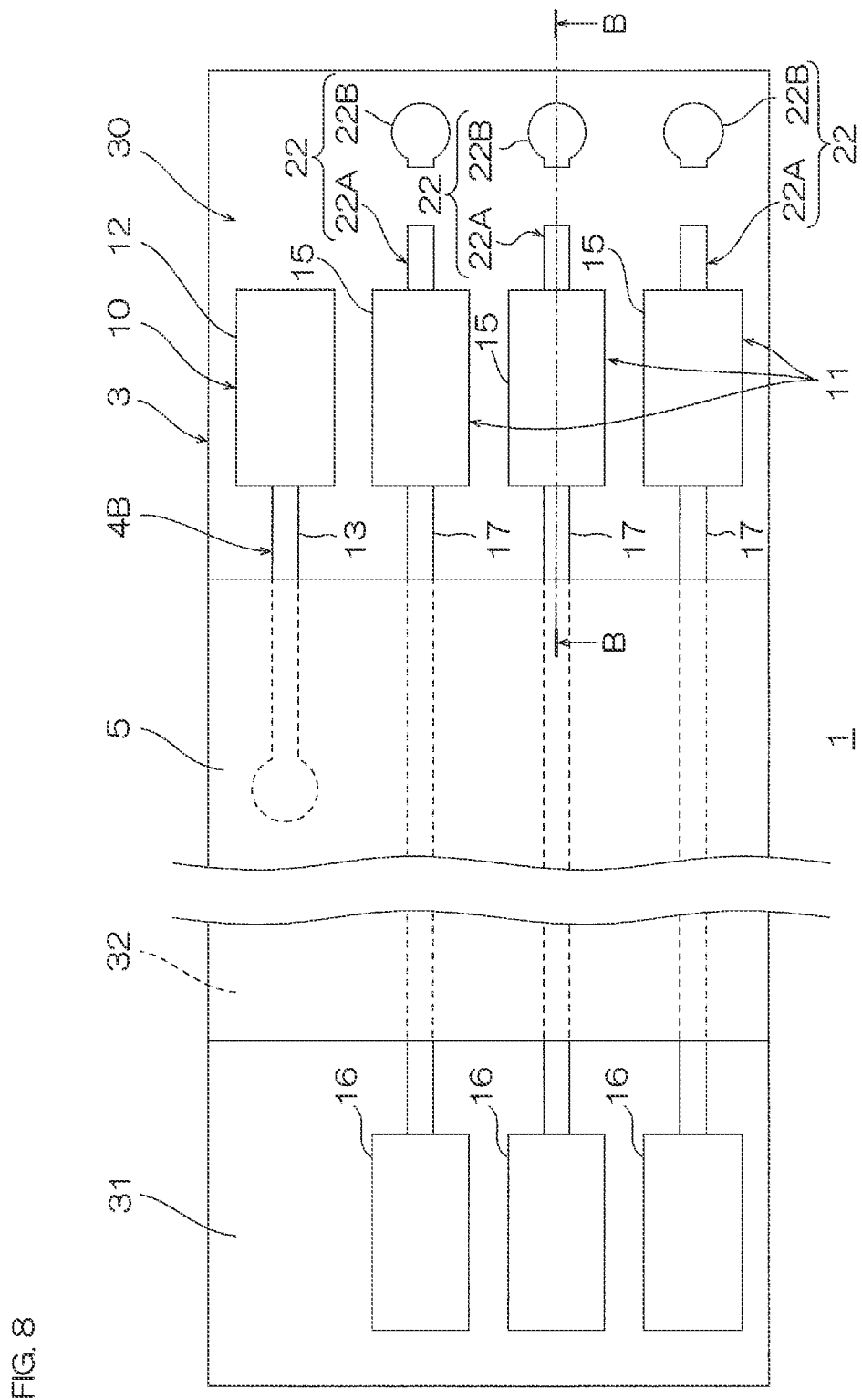
FIG. 8 shows a plan view of a third embodiment of a wiring circuit board of the present invention.

In the third embodiment, as shown in FIG. 8, the ground lead residual portion 22 includes a first residual portion 22A and a second residual portion 22B.

Figure 9:
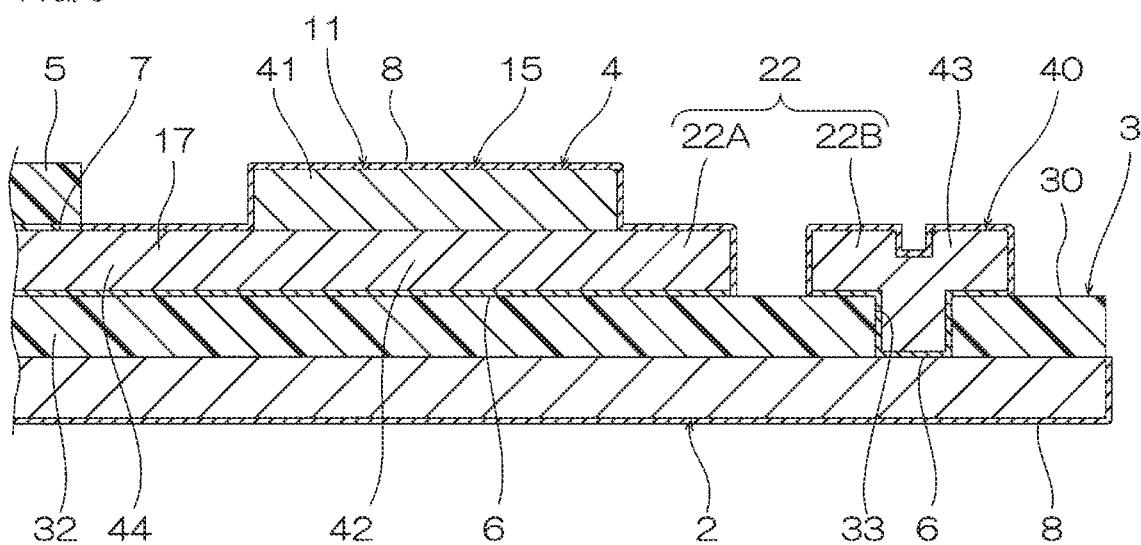
FIG. 9 shows a B-B cross-sectional view of the wiring circuit board shown in FIG. 8.

As shown in FIG. 9, the first residual portion 22A is disposed on one side in the thickness direction of the first terminal disposed portion 30. Specifically, the first residual portion 22A is disposed on one surface in the thickness direction of the first terminal disposed portion 30 via the seed film 6. The first residual portion 22A is electrically connected to the first terminal 15. The first residual portion 22A is continuous from the first terminal 15 to extend toward the opposite side of the connection wiring 17.

The second residual portion 22B is located at the opposite side of the first terminal 15 with respect to the first residual portion 22A at spaced intervals thereto. The second residual portion 22B is electrically connected to the metal support layer 2 via a through hole 33 provided in the first terminal disposed portion 30. Specifically, the second residual portion 22B fills the through hole 33 and is in contact with one surface in the thickness direction of the metal support layer 2 via the seed film 6.

Figure 10:
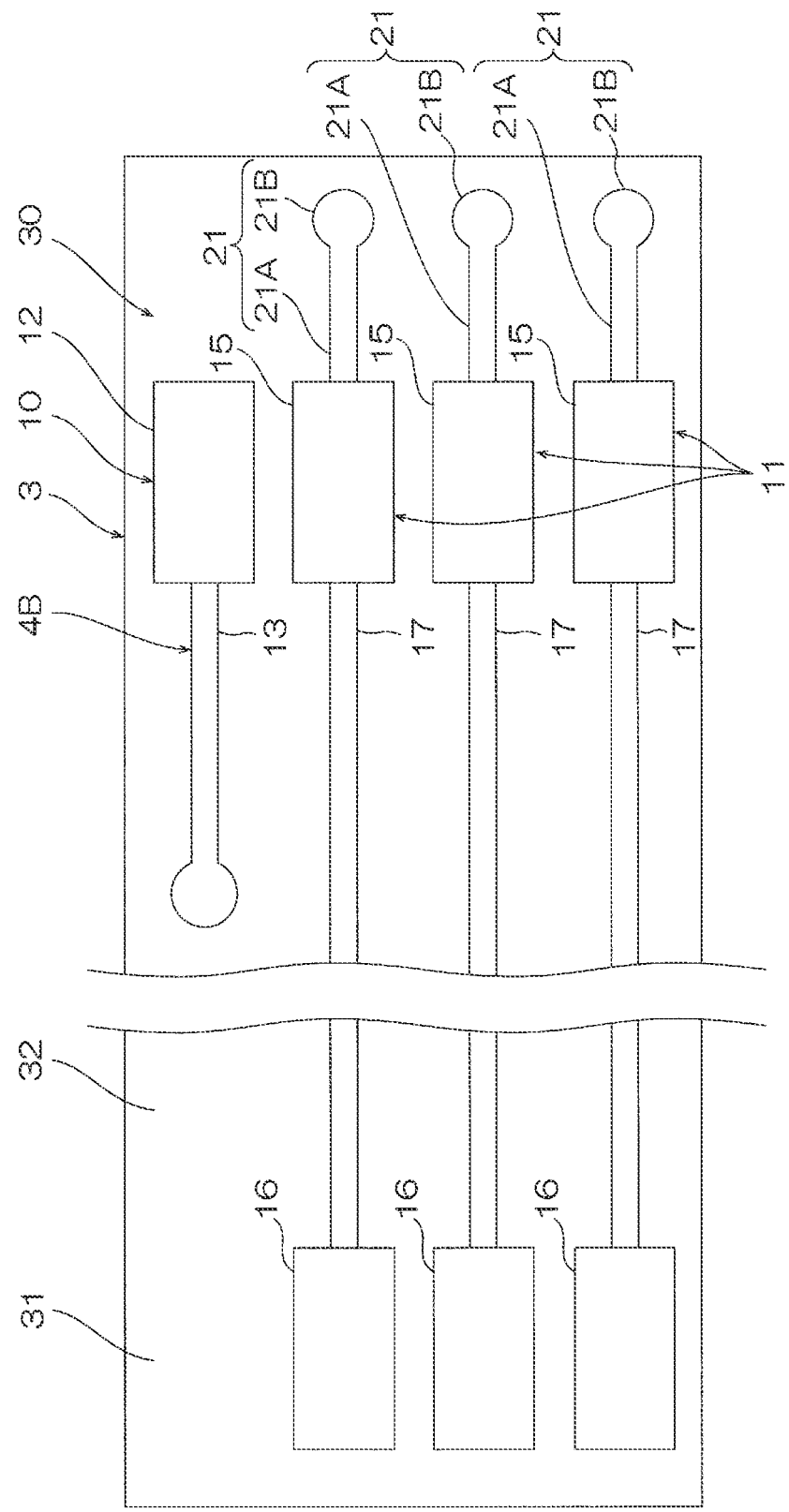
FIG. 10 shows a plan view of a conductive layer including a ground lead corresponding to the ground lead residual portion shown in FIG. 8.

To produce the wiring circuit board 1 of the third embodiment, a pre-conductive layer 4B including the first terminal 15 and a ground lead 21 is formed in the same manner as in the first embodiment. As shown in FIG. 10, the ground lead 21 has a first portion 21A corresponding to the first residual portion 22A, and a second portion 21B corresponding to the second residual portion 22B. The first portion 21A connects the first terminal 15 to the second portion 21B.

Then, after the electroless plating of the pre-conductive layer 4B to form the first plating layer 7 in the same manner as in the first embodiment (ref: FIG. 4G), the cover insulating layer 5 is formed (ref: FIG. 4H), next, the first plating layer 7 exposed from the cover insulating layer 5 is removed (ref: FIG. 4I), and thereafter, as shown in FIG. 8, a portion between a continuous portion from the first portion 21A and the second portion 21B in the ground lead 21 is removed to from the ground lead residual portion 22. Therefore, the first residual portion 22A continuous with the first terminal 15 is not located in the end portion of the wiring circuit board 1. Thereafter, as shown in FIG. 9, the seed film 6 exposed by removal of the ground lead 21 is removed, and then, the second plating layer 8 is formed in the exposed conductive layer 4.

Thus, the wiring circuit board 1 of the third embodiment is produced.

In the third embodiment, the same function and effect as that of the above-described first embodiment can be achieved. On the other hand, in the third embodiment, a portion of the seed film 6 may remain between the first residual portion 22A and the second residual portion 22B. Therefore, from the viewpoint of ensuring insulating properties of the first terminal 15 and the metal support layer 2, the first embodiment and the second embodiment are more preferable than the third embodiment.

MODIFIED EXAMPLES

In the above-described first to third embodiments, as shown in FIGS. 41 and 5J, after the removal of the first plating layer 7 exposed from the cover insulating layer 5, a portion of the ground lead 19 is removed. However, the order of the removal of the first plating layer and the removal of the ground lead is not limited to this. After the removal of a portion of the ground lead, the first plating layer exposed from the cover insulating layer may be also removed.

In the above-described first to third embodiments, as shown in FIG. 5L, the second plating layer 8 is formed by electroless plating. However, a method for forming the second plating layer is not limited to this. For example, after the removal of the first plating layer and before the removal of a portion of the ground lead, it is also possible to form the second plating layer by electroless plating using the ground lead as a plating lead (ref: FIG. 4I).

In the above-described first to third embodiments, the first terminal consists of a plurality of terminal forming layers, and the ground lead residual portion consists of the lead forming layer which has less number than the plurality of terminal forming layers. Alternatively, also, the first terminal may consist of one terminal forming layer, and the ground lead residual portion may consist of one lead forming layer continuous with the terminal forming layer. In this case, the ground lead residual portion is, for example, formed thinner than the first terminal by etching.

In addition, in the above-described first to third embodiments, the conductive layer is formed by an additive method of forming a conductive layer on a seed film after forming the seed film. However, a method for forming the conductive layer is not limited to this. The conductive layer may be also formed by a subtractive method.

The modified examples can achieve the same function and effect as that of the above-described first embodiment. Further, the first to the third embodiments and the modified examples can be appropriately used in combination.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The wiring circuit board of the present invention is, for example, used for various applications such as a wiring circuit board for an electronic device (wiring circuit board for an electronic component), and a wiring circuit board for an electric device (wiring circuit board for an electric component).

DESCRIPTION OF REFERENCE NUMERALS

1 Wiring circuit board
2 Metal support layer
3 Base insulating layer
4 Conductive layer
4A Pre-conductive layer
4B Pre-conductive layer
6 Seed film
15 First terminal
18 Ground lead residual portion
19 Ground lead
21 Ground lead
22 Ground lead residual portion
40 First conductive layer
41 Second conductive layer
42 First terminal forming layer
43 Lead forming layer
45 Second terminal forming layer
46 Lead forming layer

The invention claimed is:

1. A wiring circuit board comprising:
a metal support layer,
an insulating layer disposed on one side in a thickness direction of the metal support layer, and
a conductive layer disposed on one surface in the thickness direction of the insulating layer, and including:
a ground pattern including a ground terminal and electrically connected to the metal support layer; a wiring pattern including a terminal portion and not electrically connected to the metal support layer; and
a ground lead residual portion electrically connected to the terminal portion of the wiring pattern and not connected to the ground pattern,
wherein a thickness of the ground lead residual portion is thinner than a thickness of the terminal portion.

2. The wiring circuit board according to claim 1, wherein the terminal portion includes a plurality of terminal forming layers laminated in the thickness direction, and the ground lead residual portion includes a lead forming layer continuous with at least one of the plurality of terminal forming layers.

3. The wiring circuit board according to claim 1, wherein the ground lead residual portion is located in an end portion of the wiring circuit board.

4. The wiring circuit board according to claim 1, wherein a portion of the insulating layer protrudes toward the opposite side of the terminal portion with respect to the ground lead residual portion and the metal support layer in a direction in which the ground lead residual portion extends.

5. The wiring circuit board according to claim 1, wherein the ground lead residual portion is disposed on one surface in the thickness direction of the insulating layer.

6. A wiring circuit board comprising:
a metal support layer;
an insulating layer disposed on one side in a thickness direction of the metal support layer;
a conductive layer disposed on one side in the thickness direction of the insulating layer, and including a terminal portion and a ground lead residual portion electrically connected to the terminal portion;
a cover insulating layer disposed on one side in a thickness direction of the insulating layer, and covering a portion of the conductive layer; and
a plating layer covering the ground lead residual portion,
wherein a thickness of the ground lead residual portion is thinner than a thickness of the terminal portion,
wherein the terminal portion includes a plurality of terminal forming layers including a first terminal forming layer disposed on one surface in the thickness direction of the insulating layer and a second terminal forming layer disposed on one surface in the thickness direction of the first terminal forming layer,
wherein the second terminal forming layer is disposed away from the cover insulating layer in a direction perpendicular to the thickness direction, and
wherein the plating layer covers one surface in the thickness direction of the second terminal forming layer and side surfaces of the second terminal forming layer in the direction perpendicular to the thickness direction.

7. The wiring circuit board according to claim 6, wherein the ground lead residual portion includes a lead forming layer continuous with at least one of the plurality of terminal forming layers.

8. The wiring circuit board according to claim 6, wherein the ground lead residual portion is located in an end portion of the wiring circuit board.

9. The wiring circuit board according to claim 6, wherein a portion of the insulating layer protrudes toward the opposite side of the terminal portion with respect to the ground lead residual portion and the metal support layer in a direction in which the ground lead residual portion extends.

10. The wiring circuit board according to claim 6, wherein the ground lead residual portion is disposed on one surface in the thickness direction of the insulating layer.

* * * * *